United States Patent [19]

Sonoda

[11] B 3,995,171

[45] Nov. 30, 1976

[54] DECODER DRIVER CIRCUIT FOR MONOLITHIC MEMORIES

[75] Inventor: George Sonoda, Poughkeepsie, N.Y.

[73] Assignee: International Business Machines Corporation, Armonk, N.Y.

[22] Filed: Feb. 21, 1974

[21] Appl. No.: 444,437

[44] Published under the second Trial Voluntary Protest Program on March 9, 1976 as document No. B 444,437.

Related U.S. Application Data

[63] Continuation of Ser. No. 267,302, June 29, 1972, abandoned.

[52] U.S. Cl. .............................. 307/205; 307/215; 307/270; 307/DIG. 4; 307/DIG. 5
[51] Int. Cl.² .................. H03K 19/08; H03K 19/34
[58] Field of Search ........... 307/205, 215, 246, 251, 307/270, 304, DIG. 4, DIG. 5; 340/173 R

[56] References Cited
UNITED STATES PATENTS

| | | | |
|---|---|---|---|
| 3,564,290 | 2/1971 | Sonoda ............................ | 307/251 |
| 3,567,968 | 3/1971 | Booher ............................ | 307/251 |
| 3,579,275 | 5/1971 | Polkinghorn et al. ............. | 307/251 |
| 3,629,618 | 12/1971 | Fujimoto ......................... | 307/251 X |
| 3,665,473 | 5/1972 | Heimbigner ..................... | 307/215 X |
| 3,702,926 | 11/1972 | Picciano et al. ................. | 307/251 X |
| 3,758,761 | 9/1973 | Henrion .......................... | 307/205 X |
| 3,798,616 | 3/1974 | Spence ........................... | 307/238 X |
| 3,801,964 | 4/1974 | Palfi et al. ...................... | 307/238 X |

OTHER PUBLICATIONS

Hsieh et al., "Mosfet Storage Array Addressing System," IBM Tech. Discl. Bull.; vol. 13, No. 8; pp. 2383–2384; 1/1971.
DeSimone "Low–Power Mosfet Decoder," IBM Tech. Discl. Bull.; vol. 13, No. 1, pp. 260–261; 6/1970.
Linton et al.; "FET Decoder Circuit;" IBM Tech. Discl. Bull.; vol. 12, No. 12, p. 2082; 5/1970.

Primary Examiner—Martin H. Edlow
Assistant Examiner—L. N. Anagnos
Attorney, Agent, or Firm—Theodore E. Galanthay

[57] ABSTRACT

The specification describes a circuit for transmitting a drive pulse from a source of pulses to a capacitive load, such as a word line or a bit line in a monolithic memory. A discharge path is provided for discharging the capacitive load, thereby preventing false selection of a word or bit line and improving the timing performance of the monolithic memory. The discharge path is shown in the form of a field effect transistor having a source to drain path from the output node to a second node dischargeable to ground potential and is gated by the source of pulses.

7 Claims, 2 Drawing Figures

DECODER DRIVER CIRCUIT FOR MONOLITHIC MEMORIES

This is a continuation, of application Ser. No. 267,302 filed June 29, 1972, and now abandoned.

CROSS REFERENCE TO RELATED PATENTS OR APPLICATIONS

U.S. Pat. No. 3,564,290, issued Feb. 16, 1971, by the same inventor and commonly assigned as the present application.

BACKGROUND OF THE INVENTION

1. Field of the Invention

The present invention relates to logic circuits comprising field effect transistors (FET's) and more particularly to such a circuit for driving a word or bit line in a monolithic memory.

2. Description of the Prior Art

The cross-referenced patent describes an FET driver circuit of the same type as the present invention. When a driver circuit of this type is used to drive one of a plurality of word or bit lines to select a particular memory cell, certain problems might arise resulting in false selection of bit or word line and degraded performance. These problems arise due to various timing considerations described later herein and also because of capacitive coupling from other bit lines into the output node of the present driver circuit. In the cross reference patent, the output node is charged or discharged through the drain to source path of the driving FET when the gating electrode renders said driving FET conductive. However, when the gating electrode is not activated, it is possible for a trapped charge to develop on the output node. The problem of trapped charge on the output node could be partially eliminated by simply placing a discharge path from the output node to ground. However, such discharge paths known in the prior art have structural connections and timing restrictions on their mode of operation which makes them inoperative to solve the problems addressed by the present invention.

SUMMARY OF THE INVENTION

It is accordingly an object of the present invention to provide an improved FET driver circuit.

It is another object of this invention to provide an improved decoder driver circuit for monolithic memories.

It is a further object of this invention to prevent the false selection of undesired word and bit lines in a monolithic memory.

Lastly, it is an object of this invention to reduce the timing restrictions in the decoder driving circuits of a monolithic memory.

DESCRIPTION OF THE DRAWINGS

The foregoing and other objects, features and advantages of the invention will be apparent from the following more particular description of the preferred embodiments of the invention as illustrated in the accompanying drawing, in which.

Figure 1:
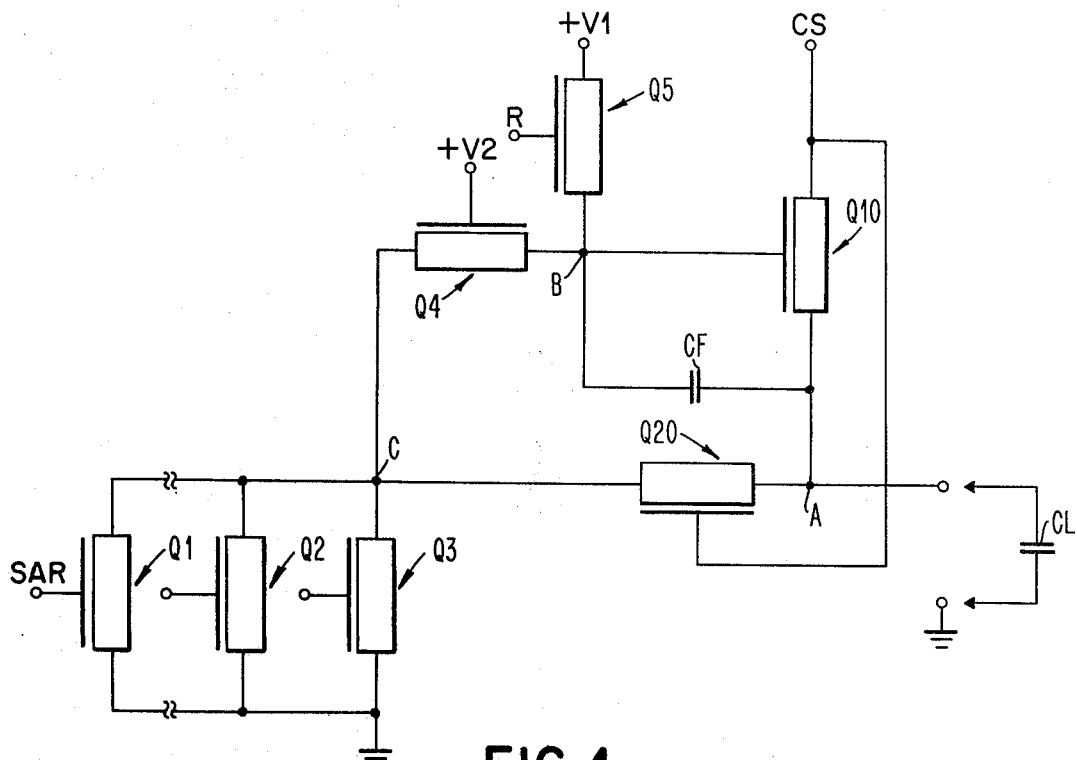
FIG. 1 shows the circuit diagram of the preferred embodiment of the invention.

Refer now to FIG. 1 which shows a circuit diagram of a preferred embodiment of the decoder driver circuit of this invention. The decode circuit is a multi-input NOR circuit represented schematically by transistors Q1, Q2, and Q3. The inputs to each of these three transistors is designated as SAR. The transistors are enhancement mode N channel FET's having a gating terminal and two gated terminals requiring an up level signal on the gating terminal in order to conduct current. The output of the NOR circuit is connected to one of the gated terminals of isolation transistor Q4 at circuit node C. The other gated terminal of isolation transistor Q4 is connected to node B while its gating terminal is connected to fixed potential plus V2. Restore transistor Q5 forms a drain to source charging path from fixed potential plus V1 to node B. The gating terminal of Q5 is connected to the restore pulse source R. Also connected to node B is the gating terminal of driving transistor Q10. The gated terminals of transistor Q10 form a drain to source path from the chip select pulse source CS to the output node A. Feedback capacitor CF is connected between the gating terminal and the output gated terminal of Q10. Transistor Q20 forms a discharge path from node A to node C through its gated terminals. As will be more apparent later, the gated terminals of Q20 can also be connected between node A and node B. Also, Q5 may be connected either to node B or node C. This flexibility results from the fact that Q4 is merely an isolation transistor to reduce the capacitance at node B that would be present if the output of the NOR circuit, usually including a large number of transistors, were directly connected to node B. The output node A is represented as being connectable to a capacitive load CL. This capacitive load represents the word line or bit line in a monolithic memory which the present circuit is designed to drive. Note also that the gating terminal of Q20 is connected to the chip select pulse source CS.

Figure 2:
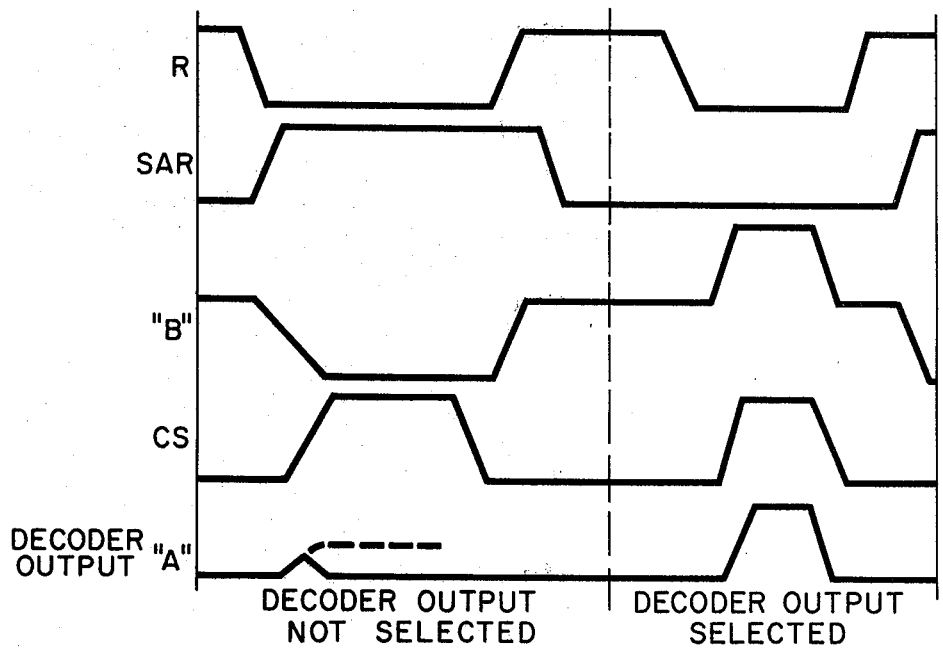
FIG. 2 is a series of waveform diagrams showing the timing relationships within the circuit of FIG. 1.

Refer now to FIG. 2 for the description of the operation of the circuit of FIG. 1. The SAR waveform (or a NOT SAR waveform) is present at each of the gating terminals of the NOR decode circuit represented by transistors Q1, Q2, and Q3. If any of the SAR inputs are at an up level, the output of the decode circuit at node C will be at a down level indicating that this particular decode circuit has not been selected. Conversely, in order to select this particular decode circuit all of the inputs to the NOR circuit must be at a down level so that node C is brought to an up level. In proper time sequence: in a given cycle, the restore pulse R is initially at an up level causing Q5 to charge node B to an up level. The restore pulse then is brought to its down level, turning Q5 off. The next signal to occur is the SAR input. If any of transistors Q1, Q2, or Q3 receive an up level SAR input, then node C is discharged through the particular one of the "on" transistors, also discharging node B through isolation transistor Q4. Accordingly, during any subsequent occurrence of the chip select pulse CS, Q10 will not conduct because of the down level condition of its gating electrode which is connected to node B. The chip select pulse CS has an up level only when the restore pulse R is at a down level. Therefore, if this particular decode circuit is not to be selected, node B should be discharged before the occurrence of the chip select CS pulse. As is well known to monolithic memory circuit designers, it is highly desirable to increase the speed of operation of a memory by shortening the cycle time of required pulses as well as shortening the delay between the occurrence of pulses. It is therefore desirable to bring the chip select pulse CS to an up level within as short a time as possible after the restore pulse R has returned to the down level. An undesirable restriction, however, occurs due to the time required to discharge node B in the event that this particular decoder is not to be selected. If the CS pulse is brought to an up level before node B is fully discharged, it is possible for Q10 to conduct for a brief interval as indicated in the rise in the waveform for node A. It is possible that this charge on node A is sufficient to falsely select a word or bit line connected to this driver circuit, even though selection was not intended.

In accordance with one aspect of the present invention, therefore, transistor Q20 is connected between node A and node C. As the CS pulse is brought to an up level, transistor Q20 is caused to conduct discharging any possible charge in accordance with the solid line of the waveform for node A. In the absence of transistor Q20, the charge would not be dissipated and remain at an up level indicated by the dotted line. By maintaining node A at the down level, false selection of a word or bit line is avoided.

During the second cycle of the waveforms shown in FIG. 2, the SAR pulse is maintained at a down level to indicate that all the inputs to transistors Q1, Q2, and Q3 are maintained at a down level. Therefore, after node B is charged to an up level, it is not subsequently discharged. At the occurrence of the CS pulse, Q10 conducts bringing node A to an up level. The potential at node B is raised even higher through feedback capacitor CF. This higher potential at node B, however, is not transferred to node C because of isolation transistor Q4. Note that the up level +V2 is less than the up level +V1. For purposes of example, consider that +V1 equals +10 volts while +V2 equals +7 volts. The SAR input varies from 0 to +5 volts while the R and CS pulses vary from 0 to 10 volts. Therefore, even though transistor Q20 is conditioned to conduct by an up level CS pulse, there is no discharge path from node A because node C is also maintained at an up level. In the mode of operation when this decode circuit is selected, Q20 serves no purpose, but is does not deteriorate the circuit operation in any manner whatsoever. It should also here be pointed out that Q20 is what is referred to by those skilled in the art as a "minimum area" device. In FET technology, it would take up particularly little room since the source and drain diffusions already exist for transistors Q4 and Q10. In order to insert transistor Q20, only a gate electrode and contact would be required.

As has already been pointed out, one of the advantages of transistor Q20 providing a discharge path from node A is the elimination of selecting undesired lines in the memory and the opportunity to improve performance by permitting CS pulses to occur before node B has been completely discharged. Another advantage of the discharge path also occurs when this particular decode circuit is not selected. When this driver circuit of FIG. 1 is used as a bit line driver, it is possible for a signal to be transferred into node A from other selected bit lines in the memory array. Since, in this example, the circuit of FIG. 1 is unselected, node B is at a down level so that this charge on node A has nowhere to go. This undesired charge signal on node A can then interfere with sense amplifier operation, since it is well known to use the same lines for bit driving and sensing, referred to as bit/sense lines. Again, the discharge path formed by transistor Q20 through node C eliminates this undesired signal and the resulting sensing difficulties.

What has been described is a decode driver circuit for driving word or bit lines in a monolithic memory array which overcomes previously encountered disadvantages in the condition when the chip was selected (indicated by an up level CS pulse) and the particular driver circuit is not selected (indicated by an uplevel SAR pulse).

Although the present invention has been described in the context of a memory driver circuit, the present invention has application in any FET circuit in which it is desired to transmit a signal CS to a capacitive output load CL through the drain to source path of an FET Q10. Such circuits usually have a gate to source feedback capacitor CF in order to overcome the threshold drop of FET Q10. Such circuits also usually have biasing means for charging the gate electrode of Q10 at node B prior to the transmission of the signal CS. The ability to apply the signals CS before node B is fully discharged and the ability to discharge node A when transistor Q10 is off are desirable features of the present invention. It should be noted that the discharge path through transistor Q20 does not require any independent timing source whatsoever, but rather is gated directly by the signal CS to the capacitive load CL.

While the invention has been particularly shown and described with reference to the preferred embodiment thereof, it will be understood by those skilled in the art that various changes in form and detail may be made therein without departing from the spirit and scope of the invention.

What is claimed is:

1. A decoder driver circuit for driving a capacitive load, such as a word line or a bit line in a monolithic memory, and for preventing false selection of undesired lines, said decoder driver circuit comprising:
   a decode circuit connected between a first fixed potential and a first node for selectively connecting said first node to said first fixed potential;
   isolation means connected in a circuit path between said decode circuit and a second node for reducing intrinsic capacitance at said second node;
   means connected between said second node and a second fixed potential for connecting said second node to said second fixed potential in response to a timing signal;
   a first FET having a drain to source path and a gating electrode, the gating electrode being connected to said second node, the drain to source path being connected between a source of pulses and an output node;
   a feedback capacitance connected between the output node and the gating electrode of said first FET;
   a capacitive load, such as a work line or a bit line in a monolithic memory, connected to said output node; and
   a second FET having a drain to source path and a gating electrode, the gating electrode being connected to said source of pulses, the drain to source path being connected between said output node and said circuit path between said decode circuit and said second node, said second FET forming a discharge path between said output node and said first fixed potential when said first node is connected to said first potential by said decode circuit, thereby maintaining said first FET non-conducting and said output node connected to said first fixed potential when said decoder driver circuit is not selected.

2. A decoder driver circuit as in claim 1 wherein said decode circuit comprises:
   a NOR circuit consisting of a plurality of field effect transistors each having a drain to source path and a gating electrode, the drain to source path of each said transistors being connected between said first node and said first fixed potential, the gating electrodes being connected to separate input nodes, a signal on one of said gating electrodes rendering a corresponding one of said field effect transistors conductive causing said decoder driver circuit not to be selected.

3. A decoder driver circuit as in claim 1 wherein said isolation means comprises:
   a third FET having a drain to source path and a gating electrode, the gating electrode being connected to a third fixed potential, the drain to source path being connected between said decode circuit and said second node.

4. A decoder driver circuit as in claim 3 wherein said third fixed potential has a potential value between the potential values of said first and second fixed potentials.

5. A decoder driver circuit as in claim 1 wherein said second FET has its drain to source path connected between said output node and said first node.

6. A decoder driver circuit for driving a capacitive load, such as a word line or a bit line in a monolithic memory, and for preventing false selection of undesired lines, said decoder driver circuit comprising:
   a decode circuit consisting of a plurality of FET's having drain to source paths connected in parallel between a first fixed potential and a first node, each FET also having a gating electrode for selectively connecting said first node to said first fixed potential only if the decoder driver circuit is not to be selected;
   isolation means consisting of a first FET having a drain to source path connected in a circuit path between said decode circuit and a second node for reducing intrinsic capacitance at said second node, and having a gating electrode connected to a second fixed potential;
   means connected between said second node and a third fixed potential for connecting said second node to said third fixed potential in response to a timing signal;
   a second FET having a drain to source path and a gating electrode, the gating electrode being connected to said second node, the drain to source path being connected between a source of pulses and an output node;
   a feedback capacitance connected between the output node and the gating electrode of said second FET;
   a capacitive load such as a word line or a bit line in a monolithic memory, connected to said output node; and
   a third FET having a drain to source path and a gating electrode, the gating electrode being connected to said source of pulses, the drain to source path being connected between said output node and said circuit path between said decode circuit and said second node, said third FET forming a discharge path between said output node and said first fixed potential when said first node is connected to said first potential by said decode circuit, thereby maintaining said second FET non-conducting and said output node connected to said first fixed potential when said decoder driver circuit is not selected.

7. A decoder driver circuit for driving a capacitive load, such as a word line or a bit line in a monolithic memory, and for preventing false selection of undesired lines, said decoder driver circuit comprising:
   a decode circuit consisting of a plurality of FETs having drain to source paths connected in parallel between a first fixed potential and a first node, each FET also having a gating electrode for selectively connecting said first node to said first fixed potential only if the decoder driver circuit is not to be selected;
   means connected between said first node and a second fixed potential for connecting said first node to said second fixed potential in response to a timing signal;
   a first FET having a drain to source path and a gating electrode, the gating electrode being connected to said first node, the drain to source path being connected between a source of pulses and an output node;
   a feedback capacitance connected between the output node and the gating electrode of said first FET;
   a capacitive load such as a word line or a bit line in a monolithic memory, connected to said output node; and
   a second FET having two gated electrodes and a gating electrode, the gating electrode being connected to said source of pulses, a first of said two gated electrodes having a continuous electrical connection to said output node, a second of said two gating electrodes having a continuous electrical connection to said first node, said second FET forming a discharge path between said output node and said first node to said first fixed potential when said first node is connected to said first potential by said decode circuit, thereby maintaining said first FET non-conducting and said output node connected to said first fixed potential when said decoder driver circuit is not selected.

* * * * *